United States Patent
Li et al.

(12)

(10) Patent No.: US 10,575,416 B2
(45) Date of Patent: Feb. 25, 2020

(54) DISPLAY SCREEN COMPONENT AND DISPLAY SCREEN DEVICE HAVING SAME

(71) Applicant: SHENZHEN LEYARD OPTOELECTRONIC CO., LTD, Shenzhen (CN)

(72) Inventors: Bingfeng Li, Shenzhen (CN); Cheng Wang, Shenzhen (CN)

(73) Assignee: SHENZHEN LEYARD OPTOELECTRONIC CO., LTD., Shenzhen (CN)

( * ) Notice: Subject to any disclaimer, the term of this patent is extended or adjusted under 35 U.S.C. 154(b) by 0 days.

(21) Appl. No.: 16/003,441

(22) Filed: Jun. 8, 2018

(65) Prior Publication Data
US 2018/0359868 A1 Dec. 13, 2018

(30) Foreign Application Priority Data

Jun. 9, 2017 (CN) .......................... 2017 1 0433380

(51) Int. Cl.
| | | |
|---|---|---|
| *H05K 7/02* | (2006.01) | |
| *H05K 7/04* | (2006.01) | |
| *H05K 5/00* | (2006.01) | |
| *H01F 7/02* | (2006.01) | |
| *H05K 5/02* | (2006.01) | |
| *G09F 13/04* | (2006.01) | |
| *G09F 9/30* | (2006.01) | |
| *G09F 9/33* | (2006.01) | |

(52) U.S. Cl.
CPC ............. *H05K 5/0017* (2013.01); *G09F 9/30* (2013.01); *G09F 9/33* (2013.01); *G09F 13/04* (2013.01); *H01F 7/02* (2013.01); *H05K 5/0217* (2013.01)

(58) Field of Classification Search
USPC .......................................... 361/755, 807, 810
See application file for complete search history.

(56) References Cited

U.S. PATENT DOCUMENTS 6,659,516 B2 * 12/2003 Wang .................... E05B 63/244
292/202
2017/0220076 A1 * 8/2017 Gerbus ................. G06F 1/1681

FOREIGN PATENT DOCUMENTS

| WO | 2016065862 A1 | 5/2016 |
|---|---|---|
| WO | 2016208918 A1 | 12/2016 |

OTHER PUBLICATIONS

European Search Report for European Application No. 18176795, dated Oct. 3, 2018, 2 pages.

* cited by examiner

*Primary Examiner* — Hung S. Bui
(74) *Attorney, Agent, or Firm* — Armstrong Teasdale LLP

(57) ABSTRACT

Provided are a display screen component and a display screen device having the same. The display screen component includes: a module rear shell; a display light board, the display light board being provided on the module rear shell; and a display light board separating structure, the display light board separating structure being disposed between the module rear shell and the display light board, the display light board separating structure including a ferromagnetic body, so that the display light board separating structure separates the display light board from the module rear shell under the action of an external magnetic force. The technical solution of some embodiments of the present disclosure effectively solves a problem in the related art that a module rear shell and a display light board are difficult to separate during disassembly.

10 Claims, 4 Drawing Sheets

DISPLAY SCREEN COMPONENT AND DISPLAY SCREEN DEVICE HAVING SAME

CROSS-REFERENCE TO RELATED APPLICATIONS

This application claims the benefit of priority to Chinese Patent Application No. 201710433380.1, filed Jun. 9, 2017, which is incorporated by reference in its entirety herein.

TECHNICAL FIELD

The present disclosure relates to the technical field of disassembly of display screens, and more particularly to a display screen component and a display screen device having the same.

BACKGROUND

When an existing LED front-maintenance display screen is repaired or a certain module is replaced, the basic manner is to disassemble a screw, and then manually remove a display light board or push out the display light board through a small internal motor. The screw disassembling manner is cumbersome and inefficient, and small-pitch products do not have space for placing screws. The manner of manually prying the display light board not only is time-consuming and labor-consuming, but also causes damage to the display light board. The small internal motor-based push-out manner requires a customized motor control system. The workload is large, and an operator needs high professional skills. When the assembly is too tight, the motor is easily burned, resulting in a safety hazard.

SUMMARY

A main objective of some embodiments of the present disclosure is to provide a display screen component and a display screen device having the same, w solve a problem in the related art that a module rear shell and a display light board are difficult to separate during disassembly.

To achieve the foregoing objective, according to an aspect of an embodiment of the present disclosure, a display screen component is provided. The display screen component comprises: a module rear shell; a display light board, the display light board being provided on the module rear shell; and a display light board separating structure, the display light board separating structure being disposed between the module rear shell and the display light board, the display light board separating structure comprising a ferromagnetic body, so that the display light board separating structure separates the display light board from the module rear shell under the action of an external magnetic force.

In an exemplary embodiment, the display light board separating structure also comprises a rotating rod, the rotating rod is provided on the module rear shell, and the ferromagnetic body is provided on the rotating rod, so that the ferromagnetic body drives the rotating rod to rotate under the action of the external magnetic force and applies, on the display light board, a force away from the module rear shell.

In an exemplary embodiment, the return structure comprises a magnet provided on the module rear shell, and the magnet adsorbs the display light board separating structure to the module rear shell.

In an exemplary embodiment, the rotating rod body comprises a first rod section and a second rod section, and the pivot shafts are disposed at the junction of the first rod section and the second rod section.

In an exemplary embodiment, the rotating rod also comprises an installation board, the installation board is disposed at a free end of the first rod section, and the ferromagnetic body is provided in the installation board.

In an exemplary embodiment, a limiting block is also provided on the module rear shell, and when the ferromagnetic body abuts against the display light board, a free end of the second rod section abuts against the limiting block.

In an exemplary embodiment, a groove recessing away from the display light board is provided on the module rear shell, and the display light board separating structure is pivotably disposed in the groove.

In an exemplary embodiment, a fixing base is provided on the module rear shell, the display light board separating structure comprises pivot shafts, the pivot holes are provided on the fixing base, and the pivot shafts are provided in the pivot holes correspondingly.

In an exemplary embodiment, a return structure is provided on the module rear shell, so that the display light board separating structure is in a return state without the action of the external magnetic force.

In an exemplary embodiment, the return structure comprises a magnet provided on the module rear shell, and the magnet adsorbs the display light board separating structure to the module rear shell by means of a magnetic force on the display light board separating structure.

In an exemplary embodiment, the display light board and/or the module rear shell are provided with at least one buffer, so that when the display light board separating structure acts with the display light board, the display light board separating structure and the display light board may be buffered.

According to another aspect of an embodiment of the present disclosure, a display screen device is provided. The display screen device comprises a display screen component, the display screen component being the foregoing display screen component.

In an exemplary embodiment, the display screen device also comprises a disassembly tool, the disassembly tool cooperating with a display light board separating structure of the display screen component.

According to the technical solution of some embodiments of the present disclosure, when the module rear shell and the display light board need to be separated from each other, the magnet is close to the display light board. At this time, there will be an acting force (external magnetic force) between the ferromagnetic body and the magnet. The display light board separating structure is disposed between the module rear shell and the display light board, and the display light board separating structure internally applies an acting force on the display screen component, so that it is relatively easy to separate the module rear shell from the display light board. The technical solution of some embodiments of the present disclosure effectively solves a problem in the related art that the module rear shell and the display light board are difficult to separate during disassembly.

BRIEF DESCRIPTION OF THE DRAWINGS

The accompanying drawings, which constitute a part of the present application, are used to provide a further understanding of the present disclosure, and the exemplary embodiments of the present disclosure and the description thereof are used to explain the present disclosure, but do not constitute improper limitations to the present disclosure. In the drawing.

Figure 1:
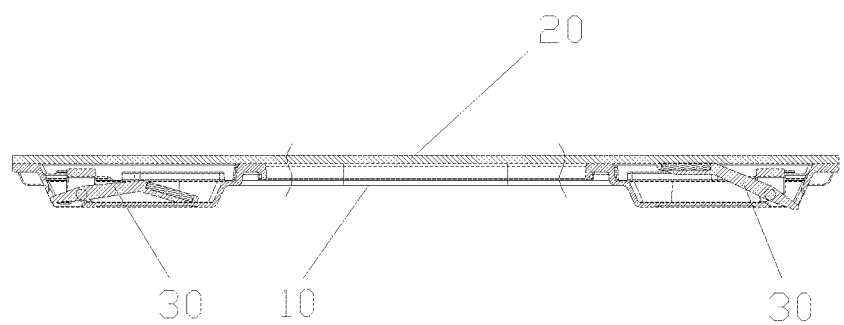
FIG. 1 shows a sectional view of a display screen component according to an embodiment of an embodiment of the present disclosure.
Figure 2:
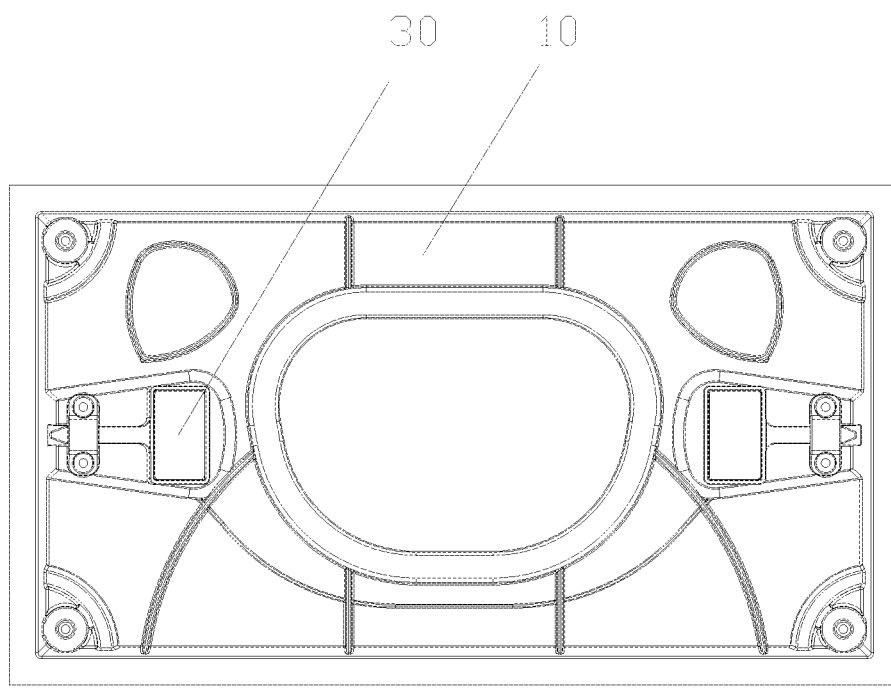
FIG. 2 shows a structure diagram of a module rear shell and a display light board separating structure of the display screen component in FIG. 1.

The drawings include the following drawing reference signs:

10, module rear shell; 11, limiting block; 12, fixing base; 121, pivot hole; 20, display light board; 30, display light board separating structure; 31, ferromagnetic body; 32, rotating rod; 321, first rod section; 322, second rod section; 323, installation board.

DETAILED DESCRIPTION OF THE EMBODIMENTS

It should be noted that the embodiments in the present application and the features in the embodiments may be combined with each other without conflict. An embodiment of the present disclosure will be described in detail below with reference to the accompanying drawings and in conjunction with the embodiments.

It should be pointed out that the following detailed descriptions are illustrative and are intended to provide further explanation of the present application. Unless defined otherwise, all technical and scientific terms used herein have the same meaning as commonly understood by a person of ordinary skill in the art to which the present application belongs.

For ease of description, spatially relative terms such as "on", "over", "on an upper surface", "above", etc. may be used herein to describe a spatial position relationship between one device or feature as shown in the figures and other devices or features. It will be appreciated that the spatially relative terms are intended to comprise different orientations of the device in use or operation in addition to the orientation of the device described in the figures. For example, if the device in the figures is turned upside down, the device described as "over other devices or configurations" or "on other devices or configurations" will be positioned "below other devices or configurations" or "under other devices or configurations". Thus, the exemplary term "over" may comprise both "above" and "below". The device may also be positioned in other different manners (rotated for 90 degrees or at other orientations), and the spatially relative descriptors used herein are interpreted accordingly.

Exemplary implementation manners according to the present application will now be described in more detail with reference to the accompanying drawings. However, these exemplary embodiments may be embodied in many different forms and should not be interpreted as being limited to the implementation manners set forth herein. It will be appreciated that these implementation manners are provided so that the disclosure of the present application is thorough and complete, and the concepts of these exemplary implementation manners are fully conveyed to a person of ordinary skill in the art. In the drawings, the thickness of layers and regions is increased for the sake of clarity, the same drawing reference signs are used to represent the same device, and therefore their descriptions will be omitted.

As shown in FIG. 1 to FIG. 8, the display screen component of the present embodiment comprises: a module rear shell 10, a display light board 20 and a display light board separating structure 30. The display light board 20 is provided on the module rear shell 10. The display light board separating structure 30 is disposed between the module rear shell 10 and the display light board 20, and the display light board separating structure 30 comprises a ferromagnetic body 31, so that the display light board separating structure 30 separates the display light board 20 from the module rear shell 10 under the action of an external magnetic force.

According to the technical solution of some embodiments of the present disclosure, when the module rear shell 10 and the display light board 20 need to be separated from each other, a magnet is close to the display light board 20. At this time, there will be an acting force (external magnetic force) between the ferromagnetic body and the magnet. The display light board separating structure 30 is disposed between the module rear shell 10 and the display light board 20, and the display light board separating structure 30 internally applies an acting force on the display screen component, so that it is relatively easy to separate the module rear shell 10 from the display light board 20. The technical solution of some embodiments of the present disclosure effectively solves a problem in the related art that the module rear shell 10 and the display light board 20 are difficult to separate during disassembly.

Figure 3:
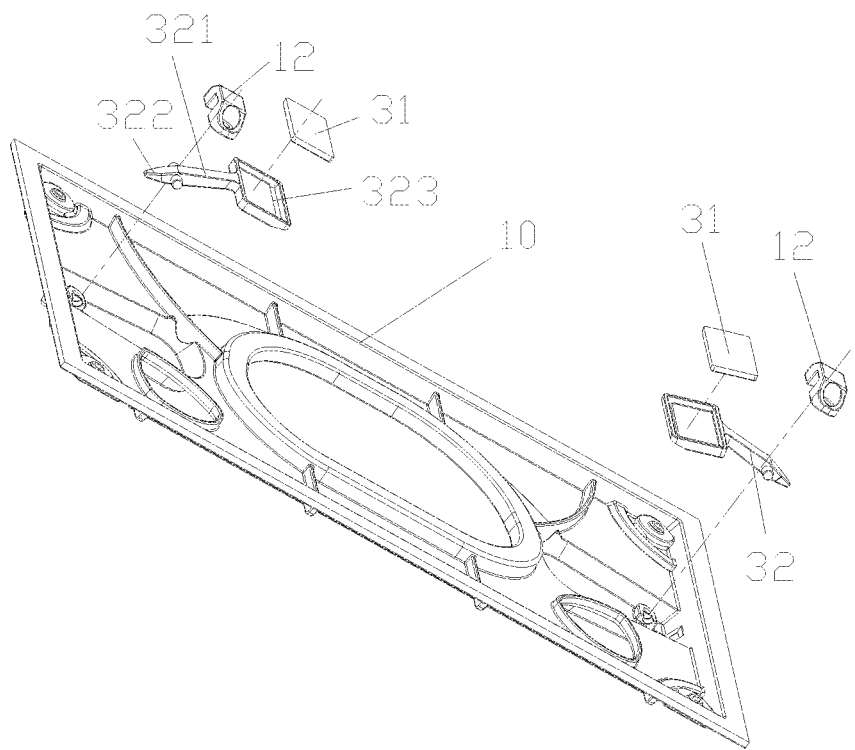
FIG. 3 shows an exploded view of the module rear shell and the display light board separating structure in FIG. 2.
Figure 4:
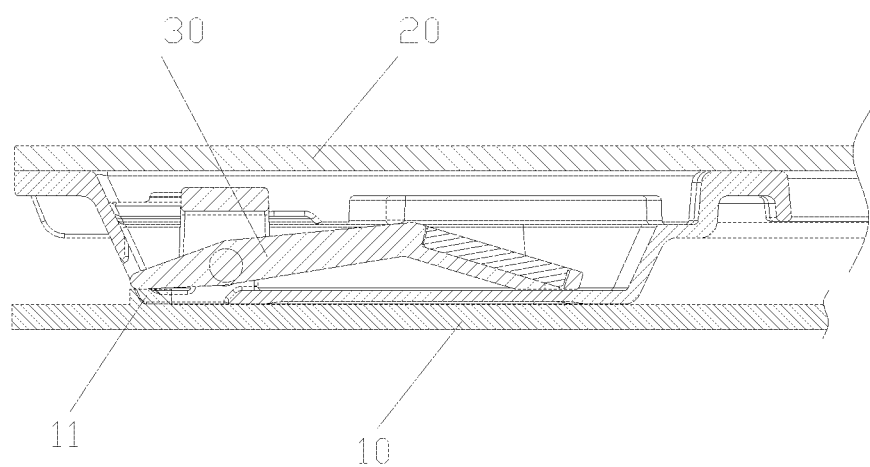
FIG. 4 shows a return state diagram of the display light board separating structure in FIG. 1.
Figure 5:
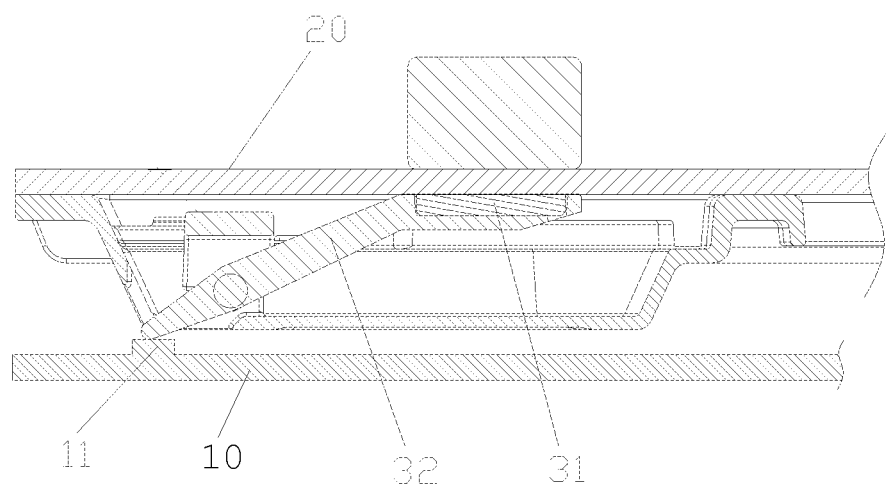
FIG. 5 shows a force application state diagram of the display light board separating structure in FIG. 1.
Figure 6:
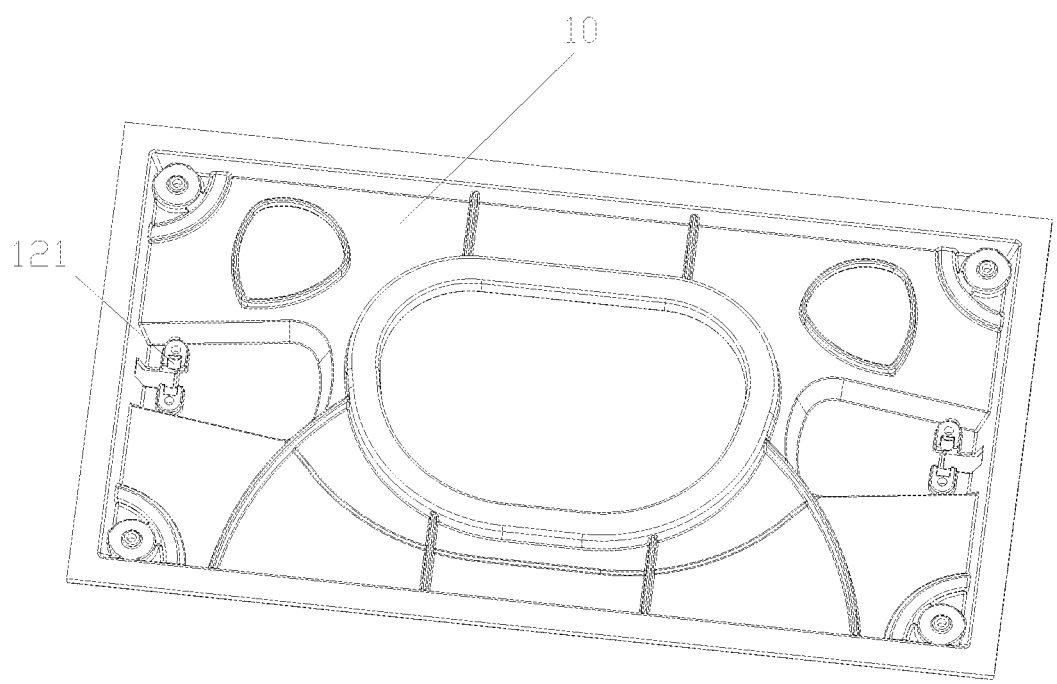
FIG. 6 shows a structure diagram of the module rear shell in FIG. 1.
Figure 7:
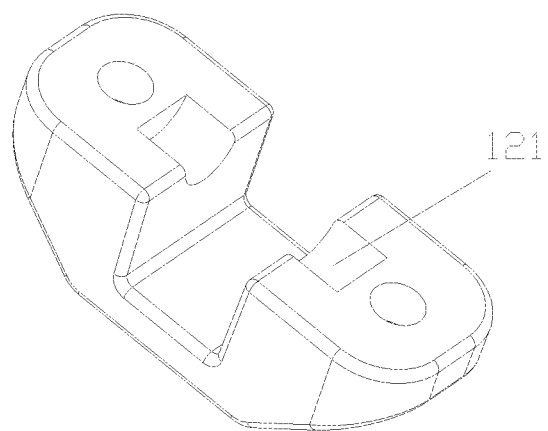
FIG. 7 shows a structure diagram of a fixing base in FIG. 1.

As shown in FIG. 3 to FIG. 5, in the technical solution of the present embodiment, the display light board separating structure 30 also comprises a rotating rod 32, the rotating rod 32 is provided on the module rear shell 10, and the ferromagnetic body 31 is provided on the rotating rod 32, so that the ferromagnetic body 31 drives the rotating rod 32 to rotate under the action of an external magnetic force and applies, on the display light board 20, a force away from the module rear shell 10. The foregoing structure is relatively low in processing cost, and easy to install.

As shown in FIG. 3 to FIG. 8, in the technical solution of the present embodiment, the rotating rod 32 comprises a rotating rod body and pivot shafts provided on both sides of the rotating rod body, and the pivot shafts are pivotally provided on the module rear shell 10. The foregoing structure is relatively low in processing cost and compact, and the stress of the rotating rod 32 is relatively balanced.

Figure 8:
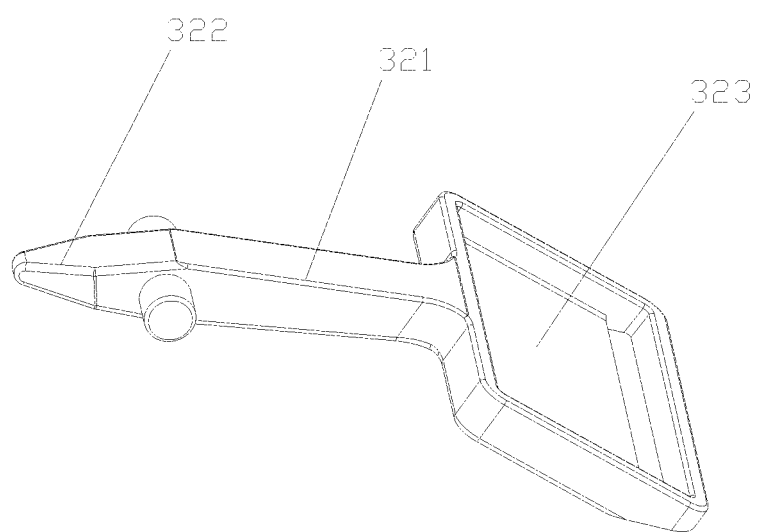
FIG. 8 shows a structure diagram of a rotating rod in FIG. 1.

As shown in FIG. 8, in the technical solution of the present embodiment, the rotating rod body comprises a first rod section 321 and a second rod section 322, and the pivot shafts are disposed at the junction of the first rod section 321 and the second rod section 322. In this way, the first rod section 321 applies a force on the display light board 20, and the second rod section 322 applies a force on the module rear shell 10. The foregoing structure can realize the application of force on the display light board 20 and the module rear shell 10 through rotation. The acting force of the rotating rod 32 on the display light board 20 and the module rear shell 10 is greatly increased. Of course, as a person skilled in the art knows, multiple display light board separating structures 30 may be provided, and the multiple display light board separating structures 30 are evenly disposed between the module rear shell 10 and the display light board 20, so that the display light board separating structure 30 applies a force that is larger and more even on the module rear shell 10 and the display light board 20.

As shown in FIG. 8, in the technical solution of the present embodiment, the rotating rod 32 also comprises an installation board 323, the installation board 323 is disposed at a free end of the first rod section 321, and the ferromagnetic body 31 is provided in the installation board 323. Thus, the ferromagnetic body 31 is more convenient to fix, and the ferromagnetic body 31 is more firmly fixed. Specifically, the installation board 323 is a groove structure, and the ferromagnetic body 31 is provided in the groove structure. The arrangement of the rotating rod 32 may amplify the magnetic force of an external magnet on the ferromagnetic body 31.

As shown in FIG. 5, in the technical solution of the present embodiment, a limiting block 11 is also provided on the module rear shell 10, and when the ferromagnetic body 31 abuts against the display light board 20, a free end of the second rod section 322 abuts against the limiting block 11. The arrangement of the limiting block 11 facilitates force application of the display light board separating structure 30 on the module rear shell 10.

As shown in FIG. 3 to FIG. 8, in the technical solution of the present embodiment, a groove recessing away from the display light board 20 is provided on the module rear shell 10, and the display light board separating structure 30 is pivotably disposed in the groove. The structure in which the display light board separating structure 30 is disposed in the groove makes the display light board separating structure 30 not easily detached, so that the display light board separating structure 30 and the module rear shell 10 cooperate more firmly.

As shown in FIG. 3 to FIG. 8, in the technical solution of the present embodiment, a fixing base 12 is provided on the module rear shell 10, the display light board separating structure 30 comprises pivot shafts, pivot holes 121 are provided on the fixing base 12, and the pivot shafts are provided in the pivot holes 121 correspondingly. The foregoing structure is relatively low in processing cost, and the cooperation structure of the pivot shaft and the pivot hole 121 is convenient to operate.

As shown in FIG. 1 to FIG. 8, in the technical solution of the present embodiment, a return structure is provided on the module rear shell 10, so that the display light board separating structure 30 is in a return state without the action of an external magnetic force. The foregoing structure ensures that the display light board separating structure 30 does not oscillate or swing freely. For example, when the display screen component is transported, the return structure allows the display light board separating structure 30 to be stabilized in a return state when it is not subjected to an external magnetic force (the external magnetic force is mainly a magnetic force of a disassembly tool), so that the display light board separating structure 30 will not vibrate during transportation.

As shown in FIG. 1 to FIG. 8, in the technical solution of the present embodiment, the return structure comprises a magnet provided on the module rear shell 10, and the magnet adsorbs the display light board separating structure 30 to the module rear shell 10. The foregoing structure is relatively low in processing cost and compact. In the technical solution of the present embodiment, the module rear shell 10 and the display light board 20 are connected together through a magnetic force action, and the magnetic force between the module rear shell 10 and the display light board 20 may be acted on the display light board separating structure 30 simultaneously, thereby greatly reducing the processing cost, and simplifying the structure of the display screen component.

As shown in FIG. 1 to FIG. 8, in the technical solution of the present embodiment, the display light board 20 and/or the module rear shell 10 are provided with at least one buffer, so that when the display light board separating structure 30 acts with the display light board 20, the display light board separating structure 30 and the display light board 20 may be buffered. This allows the display light board separating structure 30 not to damage the display light board 20. Of course, as a person skilled in the art knows, it is also possible that the display light board separating structure 30 is provided with at least one buffer or the display light board 20 is provided with at least one buffer.

The present application also provides a display screen device, comprising a display screen component. The display screen component is the display screen component described above. The display screen device of the present application may perform a front-maintenance operation very conveniently. Specifically, the display screen device further comprises a disassembly tool that cooperates with the display light board separating structure 30 of the display screen component.

It should be noted that the terms used herein are merely used to describe specific implementation manners and are not intended to limit the exemplary implementation manners according to the present application. As used herein, the singular forms "a", "an" and "the" are intended to comprise plural forms as well, unless the context clearly indicates otherwise. It will also be appreciated that when the terms "comprise" and/or "include" are used in the present specification, it is indicated that there are features, steps, operations, devices, components, and/or combinations thereof.

It should be noted that the terms "first", "second", and the like in the specification and claims of the present application and in the above drawings are used to distinguish similar objects and are not necessarily used to describe a specific sequence or order. It will be appreciated that the data used in this way may be interchanged where appropriate, so that the implementation manners of the present application described herein can be implemented, for example, in an order other than those illustrated or described herein. In addition, the terms "include" and "have" and any variations thereof are intended to cover non-exclusive inclusions. For example, a process, method, system, product, or equipment that comprises a series of steps or units need not be limited to those steps or units that are explicitly listed, and may instead comprise other steps or units that are not explicitly listed or inherent to these processes, methods, products or equipment.

The foregoing descriptions are merely preferred embodiments of the present disclosure and are not intended to limit the present disclosure. For those skilled in the art, the present disclosure may have various changes and modifications. Any modifications, equivalent replacements and improvements made within the spirit and principle of the present disclosure shall fall within the protection scope of the present disclosure.

What is claimed is:

1. A display screen component, wherein the display screen component comprising:
 a module rear shell (10);

a display light board (20), the display light board (20) being provided on the module rear shell (10); and a display light board separating structure (30), the display light board separating structure (30) being disposed between the module rear shell (10) and the display light board (20), the display light board separating structure (30) comprising a ferromagnetic body (31), so that the display light board separating structure (30) separates the display light board (20) from the module rear shell (10) under the action of an external magnetic force, wherein the display light board separating structure (30) further comprises a rotating rod (32), the rotating rod (32) is provided on the module rear shell (10), and the ferromagnetic body (31) is provided on the rotating rod (32), so that the ferromagnetic body (31) drives the rotating rod (32) to rotate under the action of the external magnetic force and applies, on the display light board (20), a force away from the module rear shell (10), wherein the rotating rod (32) comprises a rotating rod body and pivot shafts provided on both sides of the rotating rod body, and the pivot shafts are pivotally provided on the module rear shell (10), wherein the rotating rod body comprises a first rod section (321) and a second rod section (322), and the pivot shafts are disposed at the junction of the first rod section (321) and the second rod section (322).

2. The display screen component as claimed in claim 1, wherein the rotating rod (32) further comprises an installation board (323), the installation board (323) is disposed at a free end of the first rod section (321), and the ferromagnetic body (31) is provided in the installation board (323).

3. The display screen component as claimed in claim 2, wherein a limiting block (11) is also provided on the module rear shell (10), and when the ferromagnetic body (31) abuts against the display light board (20), a free end of the second rod section (322) abuts against the limiting block (11).

4. The display screen component as claimed in claim 1, wherein a groove recessing away from the display light board (20) is provided on the module rear shell (10), and the display light board separating structure (30) is pivotably disposed in the groove.

5. The display screen component as claimed in claim 4, wherein a fixing base (12) is provided on the module rear shell (10), the display light board separating structure (30) comprises pivot shafts, pivot holes (121) are provided on the fixing base (12), and the pivot shafts are provided in the pivot holes (121) correspondingly.

6. The display screen component as claimed in claim 1, wherein a return structure is provided on the module rear shell (10), so that the display light board separating structure (30) is in a return state without the action of the external magnetic force.

7. The display screen component as claimed in claim 6, wherein the return structure comprises a magnet provided on the module rear shell (10), and the magnet adsorbs the display light board separating structure (30) to the module rear shell (10).

8. The display screen component as claimed in claim 1, wherein the display light board (20) and/or the module rear shell (10) are provided with at least one buffer, so that when the display light board separating structure (30) acts with the display light board (20), the display light board separating structure (30) and the display light board (20) may be buffered.

9. A display screen device, comprising a display screen component, wherein the display screen component is the display screen component as claimed in claim 1.

10. The display screen device as claimed in claim 9, wherein further the display screen device comprising a disassembly tool, the disassembly tool cooperating with a display light board separating structure (30) of the display screen component.

* * * * *